(12) United States Patent
Randall (10) Patent No.: US 10,014,840 B2
(45) Date of Patent: Jul. 3, 2018

(54) CONTROLLING A POWER AMPLIFICATION STAGE OF AN AUDIO SIGNAL AMPLIFIER

(71) Applicant: Entotem Limited, Derby (GB)

(72) Inventor: Andrew Paul George Randall, Newbury (GB)

(73) Assignee: Entotem Limited, Derby (GB)

( * ) Notice: Subject to any disclaimer, the term of this patent is extended or adjusted under 35 U.S.C. 154(b) by 0 days.

(21) Appl. No.: 15/437,587

(22) Filed: Feb. 21, 2017

(65) Prior Publication Data

US 2017/0250665 A1    Aug. 31, 2017

(30) Foreign Application Priority Data

Feb. 26, 2016 (GB) .................................. 1603450.6

(51) Int. Cl.
| | |
|---|---|
| H03F 3/16 | (2006.01) |
| H03F 3/181 | (2006.01) |
| H03F 3/00 | (2006.01) |
| H03F 3/68 | (2006.01) |
| H03G 3/30 | (2006.01) |
| H03G 7/00 | (2006.01) |

(Continued)

(52) U.S. Cl.
CPC .......... *H03G 3/3089* (2013.01); *H03F 1/307* (2013.01); *H03F 1/3217* (2013.01); *H03F 3/005* (2013.01); *H03F 3/16* (2013.01); *H03F 3/181* (2013.01); *H03F 3/30* (2013.01); *H03F 3/3072* (2013.01); *H03F 3/68* (2013.01); *H03G 7/002* (2013.01); *H03G 7/007* (2013.01); *H03F 2200/03* (2013.01); *H03F 2200/12* (2013.01); *H03F 2200/15* (2013.01); *H03F 2200/162* (2013.01); *H03F 2200/18* (2013.01); *H03F 2203/30012* (2013.01)

(58) Field of Classification Search
USPC .......................... 330/296–297, 262, 267, 273
See application file for complete search history.

(56) References Cited

U.S. PATENT DOCUMENTS

| | | |
|---|---|---|
| 4,339,730 A | 7/1982 | Yokoyama |
| 9,705,458 B1 * | 7/2017 | Tucker .................... H03G 3/004 |

(Continued)

FOREIGN PATENT DOCUMENTS

| | | |
|---|---|---|
| GB | 2410142 A | 7/2005 |
| GB | 2515819 A | 1/2015 |

(Continued)

*Primary Examiner* — Hieu Nguyen
(74) *Attorney, Agent, or Firm* — Richard M. Goldberg (57) ABSTRACT

An audio reproduction apparatus is shown and includes an amplifier with a power amplification stage having transistors in a push-pull arrangement. A bias generator biases the transistors with a standing current. A processor receives a data stream comprising digital samples of an analog audio signal and analyzes the peak level of each group. It then determines the appropriate standing currents to maintain Class A operation of the power amplification stage given the peak levels of each of the groups. A digital to analog converter produces an analog input signal for the input stage of the amplifier from the data stream. A feedforward path between the processor and the bias generator allows the standing current to be adjusted prior to the arrival of the analog input signal in the power amplification stage.

22 Claims, 8 Drawing Sheets

(51) Int. Cl.
  *H03F 1/30* (2006.01)
  *H03F 1/32* (2006.01)
  *H03F 3/30* (2006.01)

(56) References Cited

U.S. PATENT DOCUMENTS

2009/0227297 A1* 9/2009 Muramatsu ......... H04M 1/6016
  455/567
2010/0164630 A1 7/2010 Witmer et al.

FOREIGN PATENT DOCUMENTS

JP 11-27055 A 1/1999
WO 2015038257 A2 3/2015

* cited by examiner

CONTROLLING A POWER AMPLIFICATION STAGE OF AN AUDIO SIGNAL AMPLIFIER

CROSS REFERENCE TO RELATED APPLICATIONS

This application claims priority from United Kingdom Patent App. No. 16 03 450.6 filed Feb. 26, 2016, the whole contents of which are incorporated herein by reference in their entirety.

BACKGROUND OF THE INVENTION

The present invention relates to controlling a power amplification stage (also known as an output stage) of an audio signal amplifier.

Class A amplifiers are characterized by having a quiescent point in the linear operating region of their output devices. The quiescent point is also selected so that any input signal will not drive the output devices to saturation or cut-off. In this way, the output devices conduct through 360 degrees of an input signal.

Whilst this guarantees excellent linearity and minimal distortion—both highly desirable in audio applications—conventional Class A arrangements are configured to pass all of the current necessary to drive a load at full rated power, even at low signal levels. This means that their efficiency is typically very poor, and requires the incorporation of careful thermal management in the form of sufficiently large heatsinks, or the ability to move to a more efficient mode of operation such as Class AB to reduce the amount of current dumped by the output devices.

BRIEF SUMMARY OF THE INVENTION

The present invention is therefore directed towards controlling a power amplification stage of an audio signal amplifier. A data stream comprising successive groups of contiguous digital samples of an analog audio signal is received, and the peak level of the digital samples in a group is then analyzed.

An appropriate standing current for the power amplification stage is then determined that will maintain Class A operation given the peak level of the digital samples in the group.

Digital to analog conversion of the digital samples is then carried out to form an analog input signal for application to an input stage of the audio signal amplifier, and the standing current in the power amplification stage is adjusted to said appropriate standing current prior to the arrival of the analog input signal in the power amplification stage.

The technical effect of the present invention is to guarantee the appropriate standing current is achieved in the power amplification stage by the time the signal requiring that standing current arrives there. This is achieved by using a feedforward mechanism, rather than feedback.

DETAILED DESCRIPTION OF THE INVENTION

Figure 1:
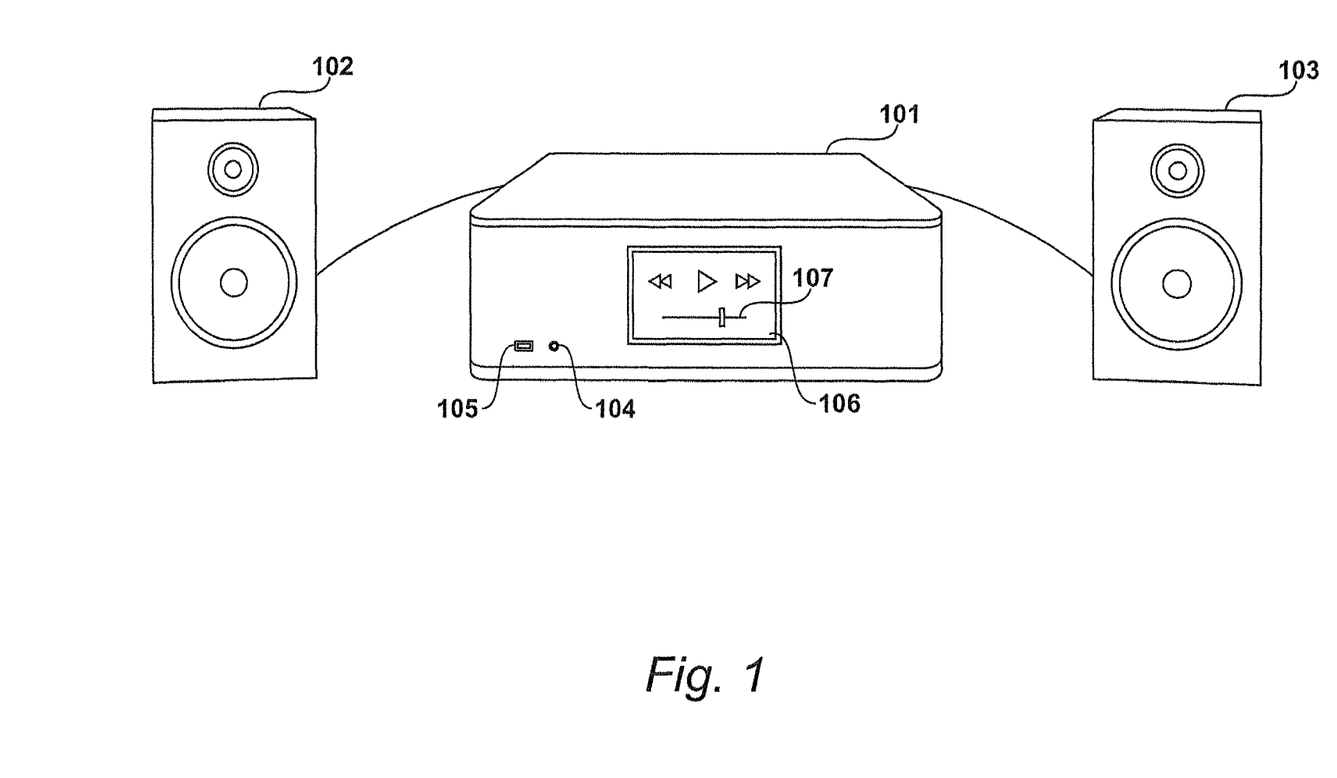
FIG. 1 shows an audio reproduction apparatus 101 according to the present invention.

FIG. 1

An audio reproduction apparatus 101 is illustrated in FIG. 1, connected with a left loudspeaker 102 and a right loudspeaker 103. In the present example, the audio reproduction apparatus 101 is designed to be relatively compact, so as to fit comfortably in a standard hi-fi equipment rack or in a media center. It is therefore around 370 millimeters wide by 130 millimeters high by 300 millimeters deep.

The audio reproduction apparatus 101 includes an audio signal amplifier to drive the loudspeakers 102 and 103. It also includes a headphone amplifier to drive a pair of headphones (not shown), which may be connected to a headphone jack 104 on the face of the audio reproduction apparatus 101.

Audio reproduction apparatus 101 includes both an internal hard disk to store music in a digital format, and both digital and analog inputs (not shown) to allow connection of, for example, a compact disc player or a turntable (not shown). A USB port 105 is also provided of the face of the audio reproduction apparatus 101 to allow digital files to be uploaded from a USB mass storage device. Thus, in use, playback of music may be achieved by selecting a track stored locally using a touchscreen 106 on the face of the audio reproduction apparatus 101, or by selecting an appropriate analog or digital input and commencing playback with the external device. Volume may be controlled using a graphical volume control 107 shown on the touchscreen 106.

In both cases, the audio must be amplified to a sufficient degree to drive the connected load, be it the loudspeakers 102 and 103, or a pair of headphones for example. Typically, high-fidelity power amplifiers operate in Class AB mode, in which the output devices conduct for just over 180 degrees of the input signal to minimize crossover distortion. Alternatively, Class D amplification may be employed in which the output devices operate at very high speed as electronic switches instead of linear gain devices, with appropriate filtering to recover the audio signal.

It is rare for Class A operation to be employed in the power amplifier in most high-fidelity audio reproduction devices, due to the inherent inefficiencies of the mode of operation and thus the requirement to include large heatsinks, or even active cooling. Thus, Class A hi-fi power amplifiers (i.e. devices which do not include a playback device or a pre-amplifier) are typically substantially larger than the audio reproduction apparatus 101, with even high efficiency Class A amplifiers such as those available from Krell Industries, LLC of Orange, Conn., USA requiring a chassis of dimensions 433 millimeters wide by 177 millimeters high by 531 millimeters deep.

The audio reproduction apparatus 101, however, includes an audio signal amplifier according to the present invention, which determines an appropriate set of operating conditions for the output devices that enable Class A operation in a small chassis that also houses other functional devices.

Figure 2:
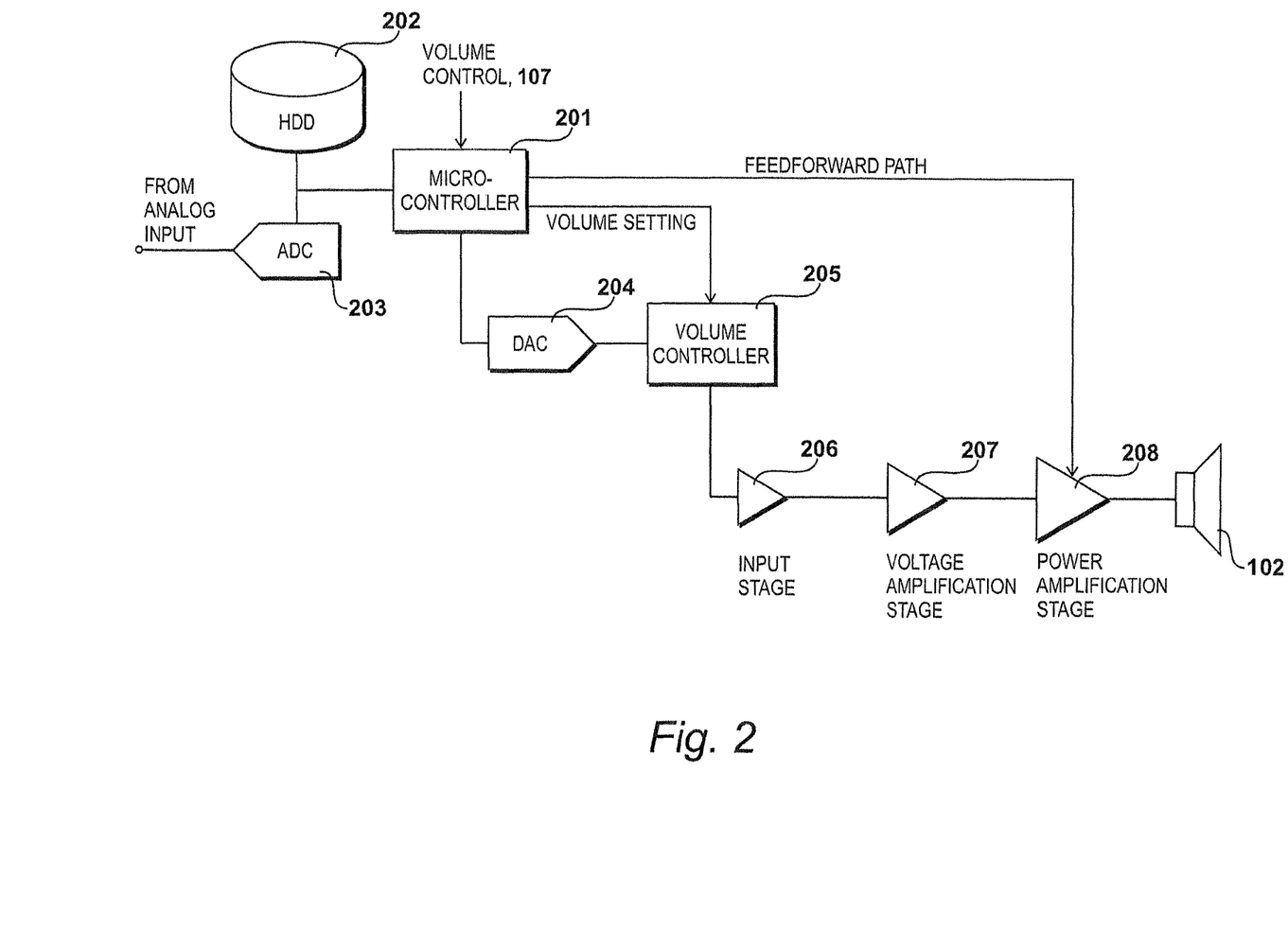
FIG. 2 shows a schematic representation of the audio reproduction apparatus 101.

FIG. 2

A schematic representation of the audio reproduction apparatus 101 is shown in FIG. 2.

In the present embodiment, all audio is channeled through a microcontroller 201. Thus, it may be stored on and retrieved from a hard disk 202 in either a compressed format (lossy, e.g. AAC, or lossless, e.g. FLAC) or uncompressed format (e.g. WAV), or received from an analog input via an analog-to-digital converter 203. In the present example, the hard disk 202 is a two terabyte hard disk drive to maximize storage capabilities, but alternatively could be a solid state drive. The analog-to-digital converter 203 is in the present example capable of sampling audio at 192 kilohertz and at a depth of 24 bits. As described in co-pending United Kingdom Patent App.

No. 15 05 817.5, which is assigned to the present applicant, the presence of the analog-to-digital converter 203 and the hard disk drive 202 allows inputs, say from a turntable, to be digitized in real time and stored locally for later playback.

To facilitate audio reproduction, the audio reproduction apparatus 101 also includes, in the present embodiment, a digital-to-analog converter 204 connected to an output of the microcontroller 201. In the present embodiment, the digital-to-analog converter 204 is a high-precision and low noise digital-to-analog converter capable of conversion of 192 kilohertz, 24 bit digital signals. The digital-to-analog converter 204 is operative to perform conversion of digital samples output by microcontroller 201 to form an analog input signal for amplification.

An analog volume control 205 of the known type is provided to apply a degree of attenuation to the output of digital-to-analog converter 204. To achieve volume control, the analog volume control 205 is connected with the microcontroller 201 which supplies it with a control signal reflective of the volume set by a user using the graphical volume control 107. A multiplying digital-to-analog converter may be used for the volume control 205 or alternatively a digital potentiometer or even a mechanical potentiometer under control of an actuator.

In an alternative embodiment, analog volume control 205 is not included and instead the digital-to-analog converter 204 includes a digital volume control system and thus receives and responds to the volume control signal received from the microcontroller 201.

The analog signal is then provided to a three stage audio signal amplifier, comprising an input stage 206, a voltage amplification stage 207 and a power amplification stage 208. Finally, the output is provided to a connected loudspeaker such as loudspeaker 102. It will be appreciated that in the schematic shown in FIG. 2, only one channel's worth of components is shown. In practice, there would be duplicates of the digital-to-analog converter, the volume control, the input stage, the voltage amplification stage and the power amplification stage to produce an output for loudspeaker 103.

In use, and as will be described further with reference to the later Figures, the microcontroller 201 receives data comprising digital samples of an analog audio signal, in this case either following decoding of audio stored on the hard disk drive 202, or directly from analog-to-digital converter 203. The samples are then analyzed to identify their peak level. The microcontroller 201 then determines the appropriate standing current for the output devices in the power amplification stage 208 to maintain Class A operation given the peak level of the digital samples. The digital audio is then converted to analog form for amplification and reproduction.

As shown in FIG. 2, microcontroller 201 is connected with the power amplification stage 208. This connection, along with the delay imposed by digital-to-analog conversion, forms a feedforward path for a control signal to be supplied by the microcontroller 201 to the power amplification stage 208.

Thus, it is possible for the standing current of the output devices in the power amplification stage 208, and, in a specific embodiment, the voltage supply to those output devices, to be adjusted before the audio requiring those adjustments arrives.

This is in contrast to existing dynamic or active bias systems, which rely on negative feedback to adjust standing current or rail voltages, and can therefore only ever take reactive measures to increases in demands. The feedforward mechanism of the present invention ensures that an appropriate standing current and, optionally, supply voltage is achieved prior to, for example, the amplification of transients.

Even when amplifying an analog source such as a turntable, it has been found that this configuration minimizes distortion far beyond any noise introduced as a result of analog-to-digital conversion followed by digital-to-analog conversion.

Figure 3:
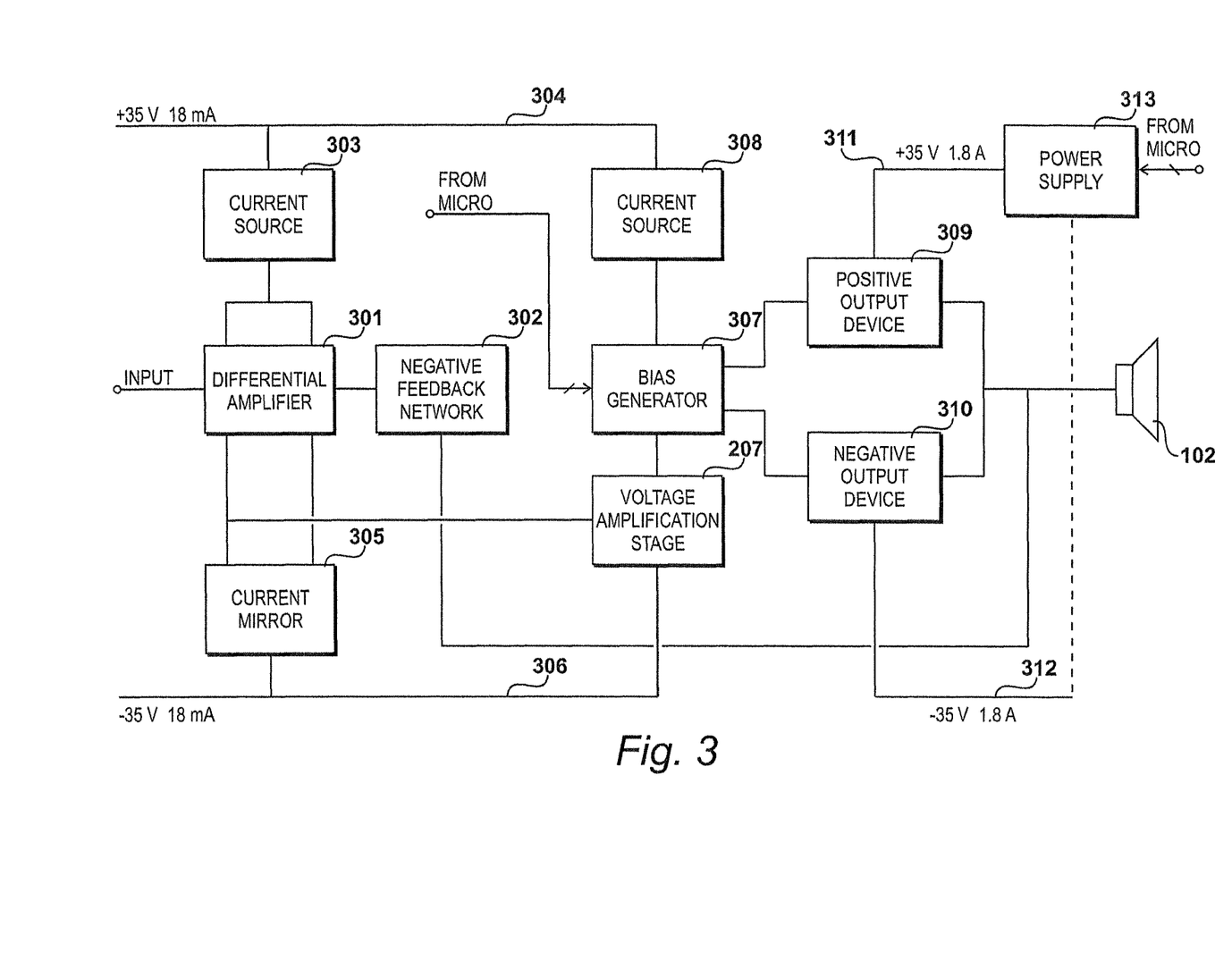
FIG. 3 is a block diagram of the three stages of the audio signal amplifier in the audio reproduction apparatus 101.

FIG. 3

A block diagram of the three stages of the audio signal amplifier in the audio reproduction apparatus 101 is shown in FIG. 3.

The input stage 206 is provided by a differential amplifier 301, which in the present example is a long tailed pair of the known type. The input signal is provided to the control terminal of non-inverting transistor in the long tailed pair, and a feedback signal produced by a negative feedback network 302 of the known type is provided to the control terminal of the inverting transistor in the long tailed pair. Constant current for the long tailed pair is provided by a current source 303 which draws supply from a first positive rail 304, and current is kept equal regardless of load in each tail of the long tailed pair using a current mirror 305 which draws supply from a first negative rail 306. In the present example, the first positive rail and first negative rail are respectively set at +35 volts and −35 volts, and are rated at 18 milliamps. It will be appreciated, however, that alternative ratings could be used depending on the application.

The output of the differential amplifier 301 is provided to the voltage amplification stage 207 for providing the required degree of voltage amplification for the power amplification stage 208 to operate.

The power amplification stage 208 comprises a bias generator 307 operative to add a degree of current to the output of the voltage amplification stage 207. Constant current for the bias generator 207 is provided by its own current source 308, which draws supply from the first positive rail 304.

The bias generator 307 is connected via a positive path to the control terminal of a positive output device 309, and via a negative path to the control terminal of a negative output device 310.

It will be appreciated that the term output device used herein encompasses bipolar junction transistors (in which the control terminal is the base), field effect transistors (in which the control terminal is the gate), and thermionic valves (in which the control terminal is the grid), or functionally equivalent combinations thereof such as the complementary feedback pair or the Darlington pair, for example.

The bias generator creates a standing current operative to bias the positive output device 309 and the negative output device 310 to a sufficient degree that they operate in Class A mode. To achieve this, the bias generator 208 receives a feedforward control signal from the microcontroller 201 which effects adjustments to the level of bias. Bias generator 307 will be described further with reference to FIG. 4.

Typically, a Class A amplifier dissipates the same amount of power whether a signal is present or not. Thus, at low listening or signal levels where only 1 or 2 watts need to be dissipated in the loudspeaker, even an ideal 25 watt RMS rated push-pull Class A amplifier will still be dissipating at least 50 watts. Thus, the bias generator 307 of the present invention reduces the standing current to the point where the power amplification stage 208 will be still operating in Class A, but only dissipating the power actually required for the actual signal level.

In the present example, the positive output device 309 and the negative output device 310 are configured in a push-pull arrangement, although it should be appreciated that the principles of the present invention, in terms of control of the standing current by the bias generator 307, is applicable to single-ended power amplification stages.

The positive and negative output devices receive supply at their input terminals, respectively, from a second positive rail 311 and a second negative rail 312. In the present example, the second positive rail 311 and second negative rail 312 are respectively set at +35 volts and −35 volts, and are rated at 1.8 amps. It will be appreciated, however, that alternative ratings could be used depending on the application. Indeed, in this specific embodiment, a power supply 313 is provided which is variable and thus configured to vary the voltage in the rails under the control of microcontroller 201. The process for varying the voltage in these rails will be described further with reference to FIG. 7. In this embodiment, the variable power supply 313 is a variable switched-mode power supply, and thus voltage is varied in response to a digital control signal received from microcontroller 201 by adjusting the ratio of on-to-off time (the duty cycle) of the switching devices in it.

Finally, the outputs of the output devices are connected with the loudspeaker 102, and with the negative feedback network 302.

Figure 4:
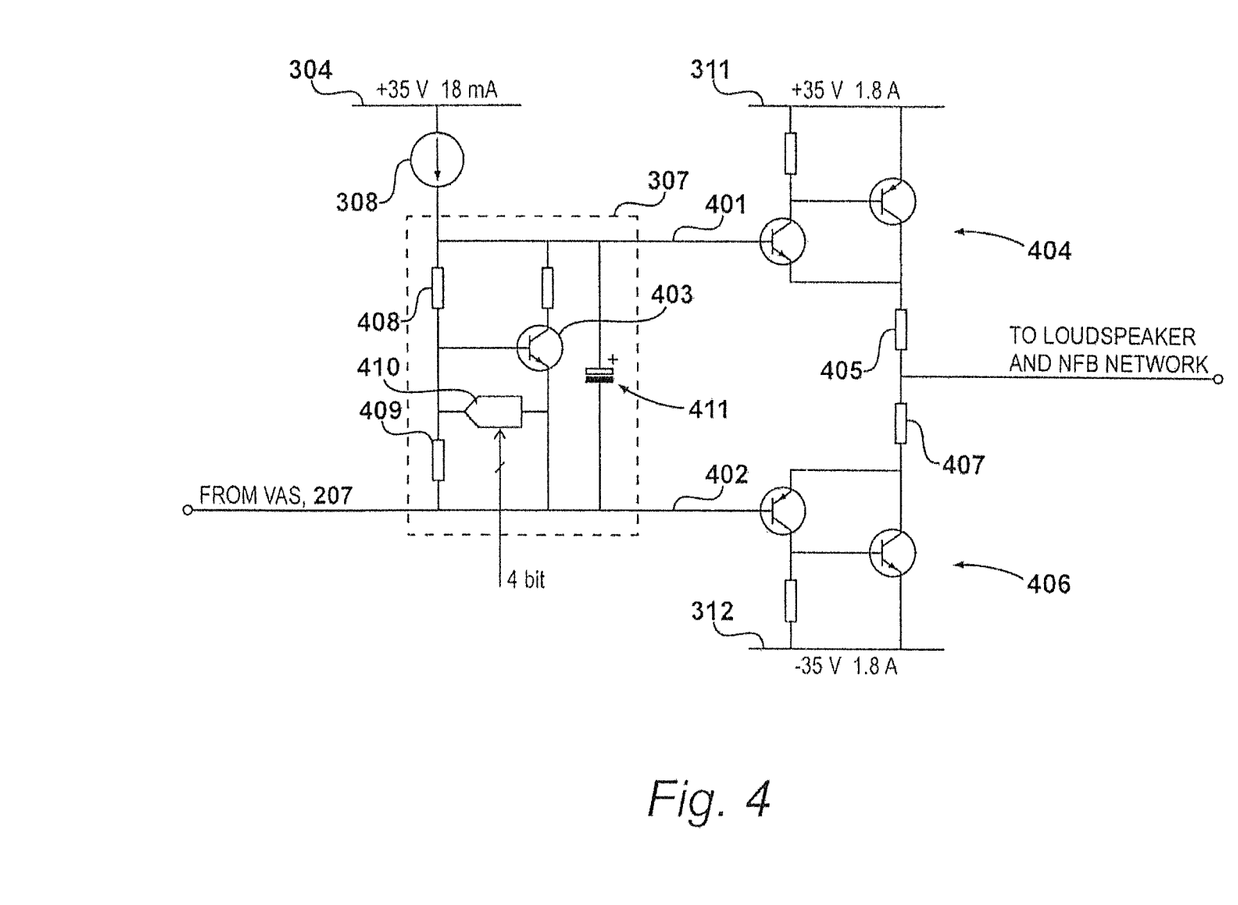
FIG. 4 shows a bias generator 307.

FIG. 4

The bias generator 307 is illustrated in FIG. 4, along with the current source 308 and the output devices of the power amplification stage 208.

The bias generator 307 receives current from the current source 308, which is split between a positive path 401 and a negative path 402 by a NPN bipolar junction transistor 403. The positive path 401 is connected with the control terminal of the positive output device 309, which in the present example is the base of a NPN complementary feedback pair 404, which has an emitter resistor 405 connected to the output node. The negative path 402 is connected with the control terminal of the negative output device 310, which in the present example is the base of a PNP complementary feedback pair 406, which has an emitter resistor 407 connected to the load. It will be appreciated that in the present embodiment the positive and negative output devices are provided by complementary feedback pairs, which have very high levels of linearity, but other output devices such as Darlington pairs, single transistors or even thermionic valves could be used.

The bias for the complementary feedback pairs 404 and 406, is determined by the ratio of resistances in a voltage divider across the positive path 401 and the negative path 402, formed by a first resistor 408 and a second resistor 409 between which the base of the transistor 403 is tapped.

Thus far, the topology of the bias generator 307 will be recognized by those skilled in the art as being a $V_{BE}$ multiplier, which is commonly used for biasing of power amplification stages. In practice, therefore, the transistor 403 will match the transistors used for the output devices 309 and 310 to ensure thermal stability, and may be thermally coupled to them. The values of the resistors 408 and 409 are configured and selected to, on their own, provide Class B operation of the power amplification stage 208.

However, in the bias generator 307 of the present invention, a digitally-controlled resistance 410 is connected in parallel with the second resistor 409. This allows the overall ratio of resistance in the voltage divider to be varied.

The digitally-controlled resistance 410 is responsive to a multi-bit control signal received from the microcontroller 201, and in this case provides a four bit resolution, i.e. 16 steps. The exact arrangement of the digitally-controlled resistance 410 will be described further with reference to FIG. 5.

When the resistance of the digitally-controlled resistance 410 is reduced, the voltage across the base-emitter junction of transistor 403 is reduced. The collector-emitter resistance increases, and as this is fed from a constant current source, the collector-emitter voltage of transistor 403 also increases. The bias voltage and, in turn, the standing current in the power amplification stage 208 also increase.

Because the digitally-controlled resistance 410 provides varying resistance in discrete steps, a capacitor 411 is provided between the positive path 401 and the negative path 402 to limit the rate of change of the bias voltage. In this way, adjustments to the output standing current are smoothed. As the capacitor 411 is in the audio signal path, in the present example a high quality aluminum electrolytic capacitor rated at 220 microfarads is used. However, it will be appreciated that any capacitor could be used so long as it limits the slew rate of the bias generator 307 to a band which is within the error correction capability of the negative feedback network 302.

Figure 5:
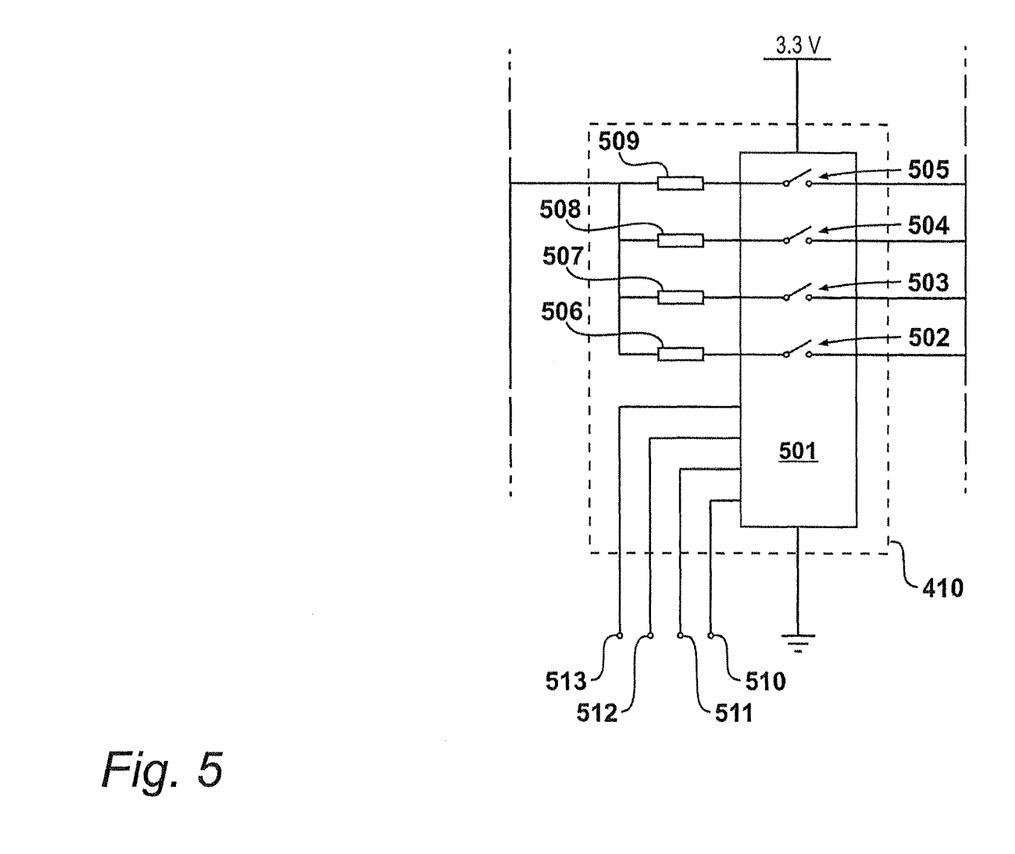
FIG. 5 shows a digitally-controlled resistance 410.

FIG. 5

As will have been noticed previously, the bias generator 307 is located in a circuit having a very high rail voltage: +35 volts in the present example. A typical digitally controlled attenuator, such as a monolithic resistor ladder digital-to-analog converter or a multiplying digital-to-analog converter would not be able to be incorporated in such a high voltage environment.

The digitally-controlled resistance 410 is shown in FIG. 5, and employs a digitally-controllable analog switch array 501. In the present example, the switch array 501 is a monolithic high voltage isolated analog switch array. An example switch array suitable for this application is the CPC7514 available from IXYS Integrated Circuits Division of Beverly, Mass., USA, which is rated to connect to electrical networks with voltages up to ±320 volts and is targeted for application in automatic test equipment, telecoms equipment, and battery monitoring and charging.

The switch array 501 itself is connected to a standard 3.3 volt supply and grounded, and has four high voltage switches 502, 503, 504, and 505. One side of each switch is connected with the negative path 402 and the other side of each switch is connected to a respective resistor 506, 507, 508, and 509. Resistors 506 to 509 are unequal in the present example, and in particular, resistor 507 is double the resistance of resistor 506, resistor 508 is double the resistance of resistor 507, and resistor 509 is double the resistance of resistor 508.

The resistors 506 to 509 are connected in parallel, to the effect that the net resistance of the digitally-controlled resistance 410 is equal to the inverse of the sum of the inverses of active resistances.

Thus, in the present embodiment 16 different resistances are selectable from zero to the inverse of the sum of the inverses of the values of resistors 506 to 509. This is achieved by providing high or low voltages on each of four inputs to the switch array 501. In particular, a first input 510 switches resistor 506 in and out, a second input 511 switches resistor 507 in and out, a third input 512 switches resistor 508 in and out, and a fourth input 513 switches resistor 509 Binary control of the switches by microcontroller 201 achieves setting of the appropriate resistance and thus adjustment of the standing current for the power amplification stage 208.

It will therefore be seen that the digitally-controlled resistance 410 of the present invention may be characterized as a binary-weighted digital-to-analog converter, albeit one that is not an integrated circuit and is instead able to cope with the high voltages and currents in the bias generator 307. Alternatively, the digitally-controlled resistance 410 could be configured as an R-2R ladder, reducing the number of different values of resistors required.

Figure 6:
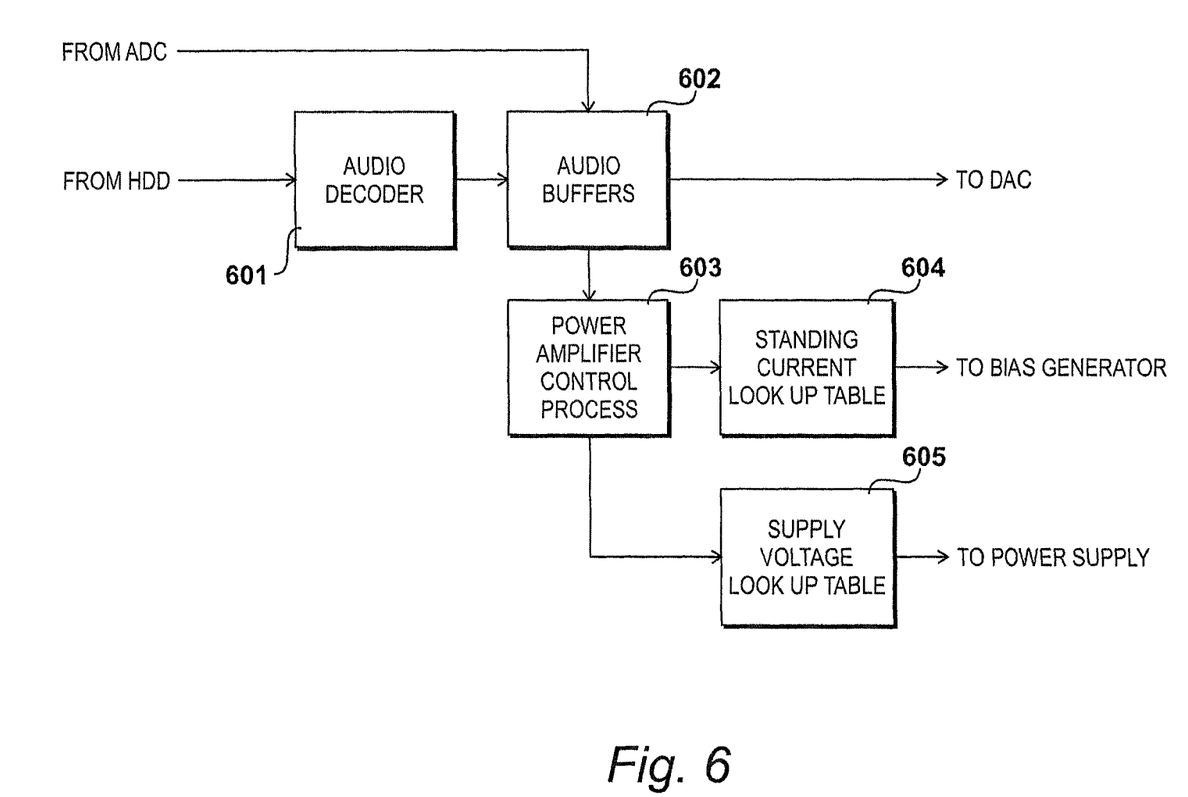
FIG. 6 is a functional block diagram of processes and data structures in microcontroller 201.

FIG. 6

A functional block diagram representing different processes and data structures in the microcontroller 201 is shown in FIG. 6.

Digital audio data is received directly from the analog-to-digital converter 203 in the form of digital signal data stream. In the present example, this is a 24 bit, 192 kilohertz pulse code modulation (PCM) data stream. Alternatively, the data stream may be produced by an audio decoding process 601 running on the microcontroller. The bit depth and sample rate of audio from the decoding process 601 is dependent upon the source material: if derived from an MPEG Layer 3 or Advanced Audio Coding encoded file, it will typically be at Compact Disc rates, i.e. 16 bit, 44.1 kilohertz, or if downloaded from a high resolution music service may be 24 bit, 192 kilohertz, for example.

The PCM data stream, whatever the source, is written into an active one of a plurality of buffers 602 in memory. In the present invention, the buffers are included to both enable analysis of the audio and to impose a delay to allow the feedforward control of the bias generator 307 and, in one embodiment, the optionally variable power supply 313 to operate. Audio data in the buffers is analyzed by a power amplifier control process 603, which performs peak level analysis on the contents of a buffer. As will be described with reference to FIG. 7, control process 603 uses the peak level in a buffer to ascertain the correct standing current to guarantee Class A operation for the contents of that buffer, and, optionally, the voltage required for the output devices in the power amplification stage. This is achieved by passing the peak level through, respectively, a standing current lookup table 604 and a supply voltage lookup table 605, both stored in memory. In the present example the lookup tables in use depends upon the rated impedance of the connected loudspeakers, and thus lookup tables are provided in memory for the typical nominal impedances of 8 ohm, 6 ohm and 4 ohm. The outputs of the lookup tables are the control signal to apply to the switch array 501 and, if variable supply voltage implemented, control signal for the power supply 313.

In the present embodiment, the size of the buffers is based on time, irrespective of the sample rate. Thus, in the present example, buffers are 10 milliseconds long. At 192 kilohertz, the buffers are therefore 1920 samples long, and at 44.1 kilohertz they are 441 samples long.

If the audio reproduction apparatus 101 of the present invention is configured such that it is only controlling the bias generator 307, then the number of buffers required is, in an example, three: one to write to, one for peak level analysis, and one to read out to the digital-to-analog converter 204. This is because the switch array 501 is capable of switching resistances in and out at high speed, and, even with capacitor 411 present, a 10 millisecond delay is sufficient for the standing current to have settled prior to the arrival of the buffer's contents in the power amplification stage.

If the power supply 313 for the output devices 309 and 310 is to be varied, then sufficient time must be provided for the voltage to increase. In a switched-mode power supply as used in the present invention, it typically takes three cycles of the mains supply (i.e. for 60 hertz mains, 50 milliseconds) for the power supply to react and stabilize. Thus sufficient buffers must be provided to give the required amount of look-ahead. In an example, therefore, eight buffers are used giving a system delay of 80 milliseconds.

It will therefore be appreciated that the buffer length used in the present invention need not be 10 milliseconds, but instead can be any length so long as it provides the requisite look-ahead to allow the standing current to increase to a sufficient value for a transient event, or the supply voltage to do the same.

Figure 7:
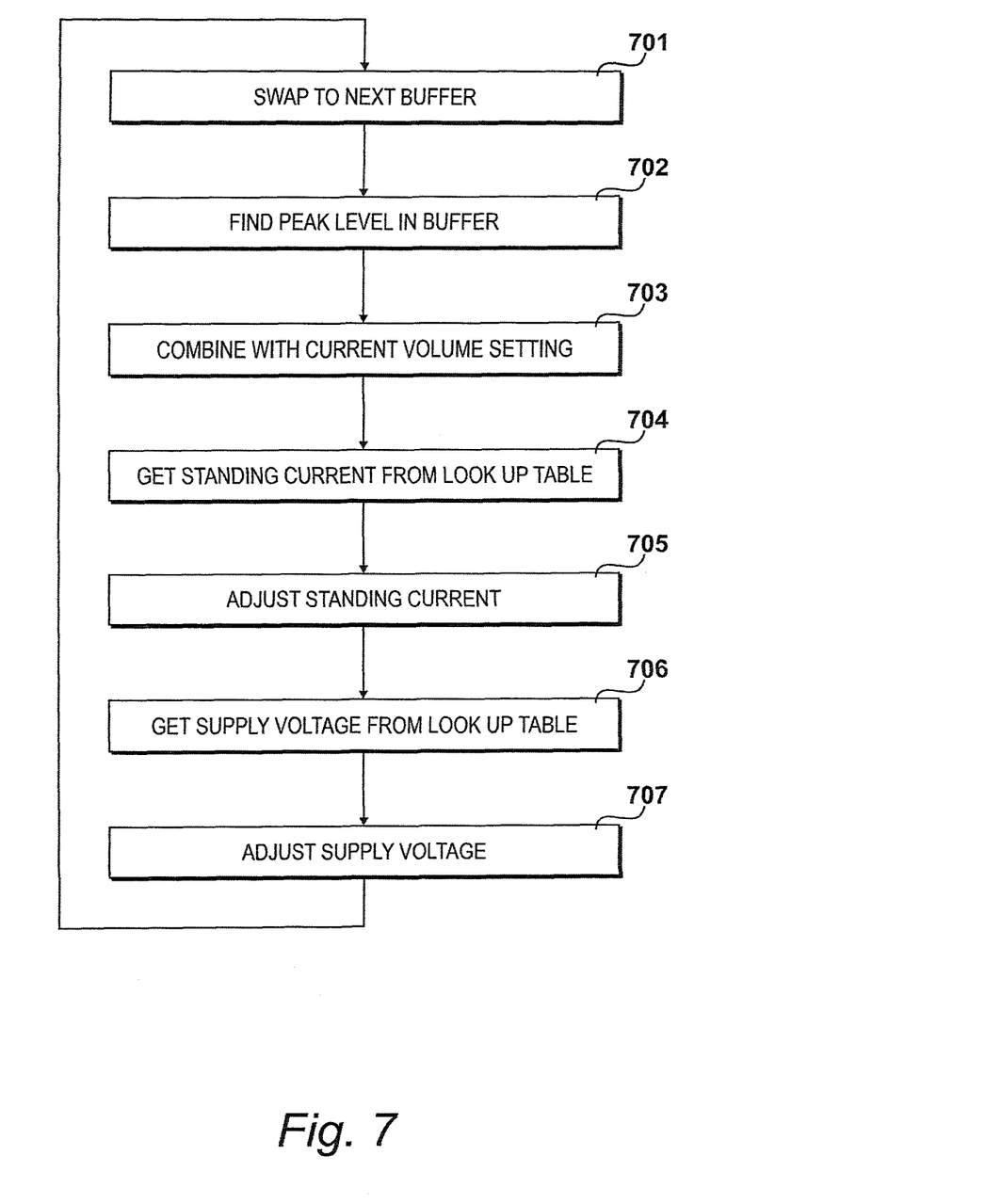
FIG. 7 shows steps carried out by a power amplifier control process 603.

FIG. 7

Steps carried out by the power amplifier control process 603 are set out in FIG. 7.

At step 701, the control process 603 swaps to the next buffer of audio data, and at step 702, the peak level is found. For example, the peak level may be found to be −12 decibels relative to full scale. In the present embodiment, this process is carried out for each of the left and right channels for stereo audio, with the greater level being used for the settings for both channels. Of course, in stereo audio it may well be the case that there is a substantial difference between channels and so further efficiencies can be found by setting the standing current in the output devices 309 and 310 independently.

At step 703, the (greater) peak level is added to the current volume setting for the audio reproduction apparatus 101, set using the volume control 107, which, for example may be −20 decibels relative to full scale. This combined value, in this example −32 decibels relative to full scale, determines the power that must be dissipated in the load.

The correct standing current to use, and thus the resistance to set in the digitally-controlled resistance 410, is obtained at step 704 from the standing current lookup table 604. The standing current is adjusted to the appropriate level at step 705.

As described, in an embodiment the supply voltage for output devices 309 and 310 may be varied in dependence upon the power that will be dissipated into the load, and so at step 706 the correct supply voltage to use is obtained at step 706 from the supply voltage lookup table 605. The voltage is adjusted to the appropriate level at step 707, whereupon, after waiting for it to be full, control returns to step 701 where the control process 603 swaps to the next buffer of audio data.

Figure 8:
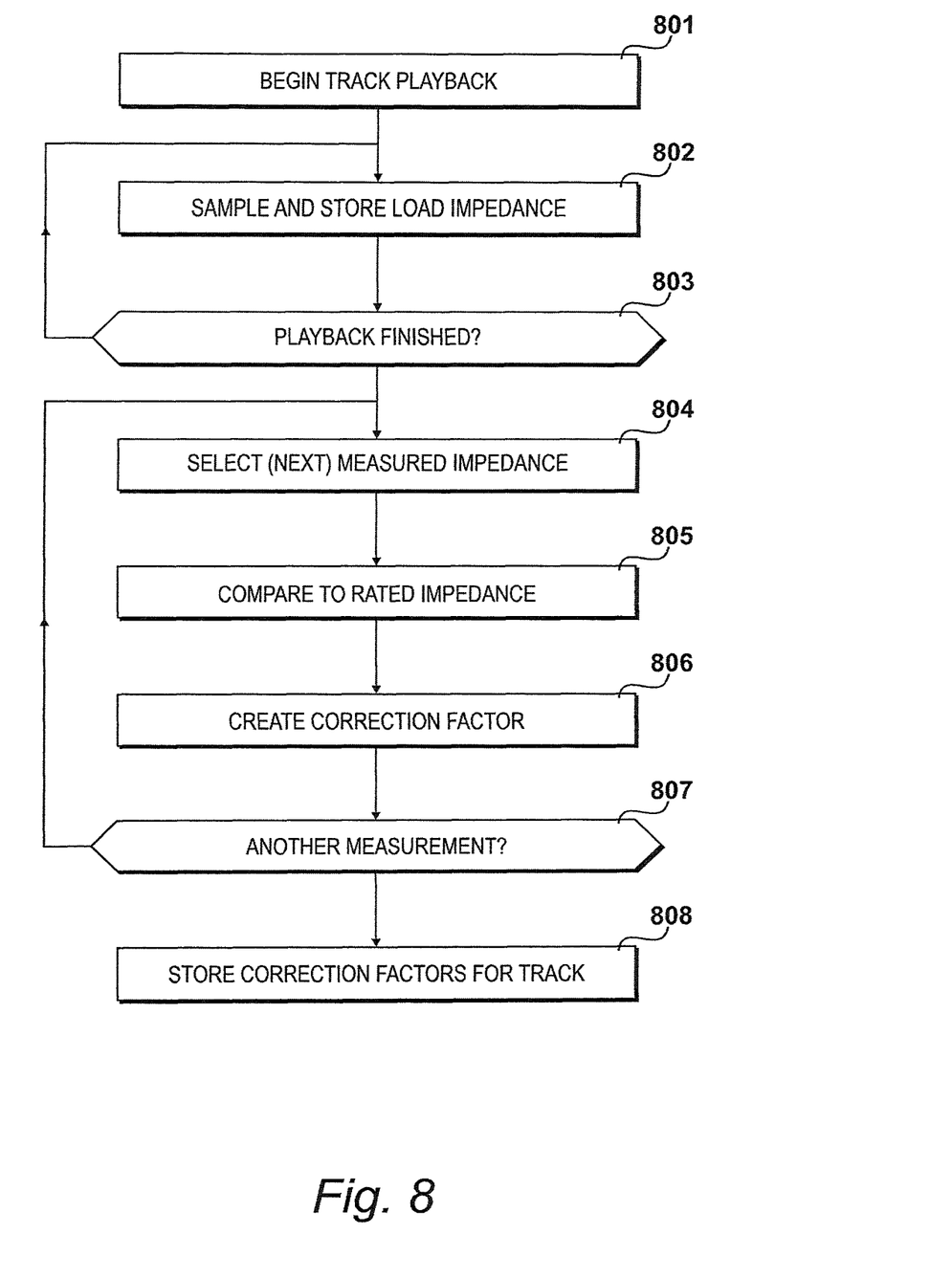
FIG. 8 shows a procedure in which a track is played back and the actual impedance of a load measured.

FIG. 8

As will be appreciated by those skilled in the art, due to the reactive nature of a speaker's impedance over the audio band frequencies, the nominal impedance of a loudspeaker is not truly representative of its actual impedance. The nominal impedance is usually determined at the lowest point after resonance. However, it is possible for the low-frequency impedance to be still lower than this, and the impedance can, due to the complexity of the loudspeaker system, result in a widely varying impedance with respect to frequency. Thus, the impedance of a loudspeaker at any moment is highly dependent upon the frequency content of the audio being played back.

In a specific embodiment of the invention, therefore, means are provided for calculating the actual impedance of the loads connected to the audio reproduction apparatus 101 for a particular piece of audio. In one embodiment, the audio reproduction apparatus 101 includes a co-processor configured to perform a fast Fourier transform on the audio buffers so as to arrive at their frequency spectrum. This is used in conjunction with a lookup table produced during a test procedure in which a test signal is played through the system and the impedance of the loads is measured with respect to frequency. In this way, the exact maximum impedance of the loads for the audio in the buffer can be known and used to further optimize the standing current and rail voltages for the power amplification stage.

Alternatively, and as set out in FIG. 8, the following procedure can be followed, in which a track is played back and the actual impedance measured.

Thus, at step 801, playback is started, and at step 802 the load impedance is sampled and stored in memory by sampling the current and voltage across the load. At step 803, a question is asked as to whether playback has finished. If not, control returns to step 802 and a further sample is taken. If so, then control proceeds to step 804. Steps 802 and 803 happen at a high rate, for example 192 kilohertz.

At step 804, a process begins of selecting a measured impedance, and then at step 805 comparing it to the rated impedance of, say, 8 ohms. At step 806, a correction factor is created by dividing the rated impedance by the actual impedance. A question is asked at step 807 as to whether there is another measurement to consider, and if so, then control returns to step 804 where the next measured impedance is selected for consideration. If the question asked at step 807 is answered in the negative, then control proceeds to step 808 where all of the created correction factors are stored for the particular track on the hard disk drive 202 in the form of a look-up table, with the index being time and the value being correction factor.

These correction factors may then be loaded into memory when the track is next played back, and used by the control process 603 at steps 704 and 706 to derive optimum settings for the standing current and supply voltage for the power amplification stage 208.

The invention claimed is:

1. A method of controlling a power amplification stage of an audio signal amplifier, comprising performing the following steps for successive groups of a plurality of contiguous digital samples of an analog audio signal received as a data stream:
    analyzing a peak level of the digital samples in a group;
    determining an appropriate standing current for the power amplification stage to maintain Class A operation given the peak level of the digital samples in the group;
    performing digital to analog conversion of the digital samples in the group to form an analog input signal for application to an input stage of the audio signal amplifier;
    adjusting the standing current in the power amplification stage prior to the arrival of the analog input signal in the power amplification stage;
    wherein each group of digital samples represents 10 milliseconds of the analog audio signal;
    wherein the standing current is generated by a bias generator connected with control terminals of transistors in the power amplification stage; and
    wherein:
        the bias generator includes a plurality of resistors in combination with a switch array responsive to a multi-bit digital control signal, configured such that the standing current is dependent upon the value of the digital control signal; and
        the adjusting step includes providing the digital control signal to the switch array.

2. The method of claim 1, further comprising smoothing shifts in standing currents using a capacitor.

3. The method of claim 1, further comprising:
    determining an appropriate supply voltage for the power amplification stage given the peak level of the digital samples; and
    adjusting the supply voltage for the power amplification stage before the arrival of the analog input signal in the power amplification stage.

4. The method of claim 3, in which the supply voltage is controlled by a variable voltage switched mode power supply connected with input terminals of transistors in the power amplification stage.

5. The method of claim 1, in which the data stream is read from a buffer that has been written to by one of:
    a decoding process operative to decode digital audio stored on a computer-readable storage medium, and
    a digitizing process operative to perform real time analog to digital conversion of an analog audio source.

6. The method of claim 1, further comprising the step of adjusting the standing current to maintain Class A operation in dependence upon actual impedance of a load connected to the power amplification stage of the audio signal amplifier.

7. The method of claim 1, in which the audio signal amplifier is one of:
    a high fidelity audio amplifier for connecting to a loudspeaker, and
    a headphone amplifier for connecting to headphones.

8. An audio reproduction apparatus comprising:
    an audio signal amplifier including a power amplification stage having a first transistor and a second transistor in a push-pull arrangement;
    a bias generator connected with a control terminal of the first transistor and a control terminal of the second transistor, and configured to generate a standing current to bias the first transistor and the second transistor;
    a processor with an input to receive a data stream comprising digital samples of an analog audio signal, and which is configured to, for successive groups of contiguous digital samples received in the data stream, analyze a peak level of the digital samples in each of the groups and determine appropriate standing currents to maintain Class A operation of the power amplification stage given the peak level of the digital samples in each of the groups;
    a feedforward path between the processor and the bias generator; and
    a digital to analog converter to form an analog input signal for an input stage of the audio signal amplifier using the digital samples in each of the groups;
    wherein the processor is configured to adjust the standing current generated by the bias generator prior to the arrival of the analog input signal in the power amplification stage;

wherein the first transistor is a first complementary feedback pair and the second transistor is a second complementary feedback pair.

9. The audio reproduction apparatus of claim 8, in which each group of digital samples represents 10 milliseconds of the analog audio signal.

10. The audio reproduction apparatus of claim 8, in which the processor is further configured to:
   determine an appropriate supply voltage for the power amplification stage given the peak level of the digital samples; and
   adjust the supply voltage for the power amplification stage before the arrival of the analog input signal in the power amplification stage.

11. The audio reproduction apparatus of claim 10, in which the supply voltage is controlled by a variable voltage switched mode power supply connected with the input terminals of transistors in the power amplification stage.

12. The audio reproduction apparatus of claim 8, in which the processor reads said data stream from a buffer that has been written to by one of:
   a decoding process operative to decode digital audio stored on a computer-readable storage medium, and
   a digitizing process operative to perform real time analog to digital conversion of an analog audio source.

13. The audio reproduction apparatus of claim 8, in which the processor is further configured to adjust the standing current to maintain Class A operation in dependence upon actual impedance of a load connected to the power amplification stage of the audio signal amplification apparatus.

14. The audio reproduction apparatus of claim 8, configured as one of:
   a high fidelity audio amplifier for connecting to a loudspeaker, and
   a headphone amplifier for connecting to headphones.

15. An audio reproduction apparatus comprising:
   an audio signal amplifier including a power amplification stage having a first transistor and a second transistor in a push-pull arrangement;
   a bias generator connected with a control terminal of the first transistor and a control terminal of the second transistor, and configured to generate a standing current to bias the first transistor and the second transistor;
   a processor with an input to receive a data stream comprising digital samples of an analog audio signal, and which is configured to, for successive groups of contiguous digital samples received in the data stream, analyze a peak level of the digital samples in each of the groups and determine appropriate standing currents to maintain Class A operation of the power amplification stage given the peak level of the digital samples in each of the groups;
   a feedforward path between the processor and the bias generator; and
   a digital to analog converter to form an analog input signal for an input stage of the audio signal amplifier using the digital samples in each of the groups;
   wherein the processor is configured to adjust the standing current generated by the bias generator prior to the arrival of the analog input signal in the power amplification stage;
   wherein:
      the bias generator includes a plurality of resistors in combination with a switch array responsive to a multi-bit digital control signal, configured such that the standing current is dependent upon the value of the digital control signal; and
      the processor is configured to supply the digital control signal to the switch array.

16. The audio reproduction apparatus of claim 15, in which the bias generator further comprises a capacitor to smooth shifts in standing currents.

17. The audio reproduction apparatus of claim 15, in which each group of digital samples represents 10 milliseconds of the analog audio signal.

18. The audio reproduction apparatus of claim 15, in which the processor is further configured to:
   determine an appropriate supply voltage for the power amplification stage given the peak level of the digital samples; and
   adjust the supply voltage for the power amplification stage before the arrival of the analog input signal in the power amplification stage.

19. The audio reproduction apparatus of claim 18, in which the supply voltage is controlled by a variable voltage switched mode power supply connected with the input terminals of transistors in the power amplification stage.

20. The audio reproduction apparatus of claim 15, in which the processor reads said data stream from a buffer that has been written to by one of:
   a decoding process operative to decode digital audio stored on a computer-readable storage medium, and
   a digitizing process operative to perform real time analog to digital conversion of an analog audio source.

21. The audio reproduction apparatus of claim 15, in which the processor is further configured to adjust the standing current to maintain Class A operation in dependence upon actual impedance of a load connected to the power amplification stage of the audio signal amplification apparatus.

22. The audio reproduction apparatus of claim 15, configured as one of:
   a high fidelity audio amplifier for connecting to a loudspeaker, and
   a headphone amplifier for connecting to headphones.

* * * * *